US005143169A

United States Patent [19]

Ziegenberg et al.

[11] Patent Number: 5,143,169

[45] Date of Patent: Sep. 1, 1992

[54] LOUDSPEAKER DIAPHRAGM PROVIDED WITH A REAR LOAD

[75] Inventors: Alfred Ziegenberg, Villingen-Schwenningen-Marbach; Edmund Schiessle, Schorndorf, both of Fed. Rep. of Germany

[73] Assignee: Mercedes-Benz AG, Fed. Rep. of Germany

[21] Appl. No.: 577,002

[22] Filed: Sep. 4, 1990

[30] Foreign Application Priority Data

Sep. 2, 1989 [DE] Fed. Rep. of Germany ....... 3929266

[51] Int. Cl.[5] .............................................. H05K 5/00

[52] U.S. Cl. .................................. 181/144; 181/154; 181/163; 181/172

[58] Field of Search ............... 181/144, 145, 150, 153, 181/154, 156, 163, 170, 172, 158; 381/184, 185, 186

[56] References Cited

U.S. PATENT DOCUMENTS

| | | | |
|---|---|---|---|
| 2,022,060 | 8/1934 | Swickard | 181/144 |
| 3,201,529 | 8/1965 | Surh | 381/186 |
| 3,772,466 | 11/1973 | Hossbach | 381/184 |
| 4,477,699 | 10/1984 | Wada et al. | 181/163 |
| 4,582,163 | 4/1986 | Catthoor | 181/172 X |

FOREIGN PATENT DOCUMENTS

| | | |
|---|---|---|
| 1109736 | 6/1961 | Fed. Rep. of Germany . |
| 2236374 | 3/1974 | Fed. Rep. of Germany . |
| 2553070 | 5/1976 | Fed. Rep. of Germany . |
| 2626652 | 12/1977 | Fed. Rep. of Germany . |
| 2937926 | 3/1980 | Fed. Rep. of Germany . |
| 3018659 | 11/1981 | Fed. Rep. of Germany . |

*Primary Examiner*—L. T. Hix
*Assistant Examiner*—Khanh Dang
*Attorney, Agent, or Firm*—Evenson, Wands, Edwards, Lenahan & McKeown

[57] ABSTRACT

The present invention relates to a loudspeaker diaphragm which is provided with a rear load and the vibration characteristic of which is improved in that the work to be performed for compressing the air behind the loudspeaker diaphragm is reduced. For this purpose, the loudspeaker diaphragm is provided with openings so that the air located behind the loudspeaker diaphragm can escape. At the same time, the introduction of the openings causes a decoupling of the vibrating diaphragm parts with respect to the frequency response when the loudspeaker diaphragm and the openings are suitably dimensioned, so that it is predominantly the inner part of the loudspeaker diaphragm which vibrates in the case of high notes, while the entire loudspeaker diaphragm vibrates in the case of low notes.

17 Claims, 1 Drawing Sheet

LOUDSPEAKER DIAPHRAGM PROVIDED WITH A REAR LOAD

BACKGROUND AND SUMMARY OF THE INVENTION

The invention relates to a loudspeaker diaphragm provided with a rear load, the loudspeaker diaphragm exhibiting a point symmetry with respect to the center point of the loudspeaker diaphragm and/or an axial symmetry with respect to an axis extending through the center point of the loudspeaker diaphragm. The loudspeaker diaphragm and its rear load form the surface of a volume with openings being introduced into the surface of this volume. The openings introduced into the loudspeaker diaphragm and the center points of the openings exhibit a point symmetry with respect to the center point of the loudspeaker diaphragm and/or an axial symmetry with respect to an axis extending through the center point of the loudspeaker diaphragm.

From German (Auslegeschrift) published Examined Application 1,109,736, a generic loudspeaker diaphragm is already known which is attached to a part of a moving coil system and forms a volume with a rear wall. In this arrangement, the loudspeaker diaphragm is provided with holes which exhibit a point and axial symmetry with respect to the center point. These holes can have a circular shape in this arrangement.

In addition, a loudspeaker diaphragm is known from German Patent Document DE 22 36 374 A1 which is connected to a moving coil system in a magnet arrangement for the purpose of generating sound waves. In this arrangement, the loudspeaker diaphragm forms the surface of a volume with the magnet arrangement. Furthermore it is known from German Patent Document DE 22 36 374 A1, to introduce air gaps into the magnet arrangement in order to reduce the volume of the air to be compressed by the loudspeaker diaphragm. This is achieved, by the air being urged out of the volume through the air gaps of the magnet arrangement during the phase when the loudspeaker diaphragm is moving towards the magnet arrangement. When the loudspeaker membrane is moving away from the magnet arrangement again, the air follows into the volume through these air gaps.

It is an object of the invention to minimize disturbing effects on the vibration characteristic of a loudspeaker diaphragm that are due to air to be compressed during the process of movement of the loudspeaker diaphragm, and in so doing to improve the vibration characteristic of the loudspeaker diaphragm at the same time.

In a loudspeaker diaphragm of the above-noted type, this object is achieved, according to a preferred embodiment, by means of an arrangement wherein a further loudspeaker diaphragm is attached behind the loudspeaker diaphragm, wherein the further loudspeaker diaphragm is point-symmetric with respect to the center point of the loudspeaker with further diaphragm and/or axially symmetric with respect to an axis extending to the center point of the loudspeaker diaphragm, this center point of the further loudspeaker diaphragm being located on a line which passes through the center point of the further loudspeaker diaphragm, this line forming a right angle with the loudspeaker diaphragm, wherein the further loudspeaker diaphragm is connected force locked in the area of the center point to the same part as the moving coil system as the further loudspeaker diaphragm, and the further loudspeaker diaphragm is coupled at its outer circumference to the loudspeaker diaphragm, the outer circumference of the further loudspeaker diaphragm being located with the area of the loudspeaker diaphragm which is defined by the inner edge of the outer are, wherein the openings of the loudspeaker diaphragm are introduced in the part of the area of the loudspeaker diaphragm which forms a volume with the further loudspeaker diaphragm, and wherein the loudspeaker diaphragm and the further loudspeaker diaphragm are attached to the moving coil system with a particular spacing.

Further advantages of the invention compared with the known prior art consist in the fact that the mass of the loudspeaker diaphragm to be moved during the vibration process is reduced, which leads to an improved response to the loudspeaker, particularly at high frequencies. In addition, the vibration characteristic of the loudspeaker diaphragm at high frequencies is improved.

In wide-band loudspeakers, one aim is to concentrate the area vibrating at high frequencies to the center of the loudspeaker diaphragm by means of constructional measures. Due to its dimensions, the vibration of the overall loudspeaker diaphragm leads to interference phenonema at high frequencies which result in a distinct directional characteristic of the radiation at these high frequencies. On the other hand, the loudspeaker diaphragm must have a certain minimum size in order to be able to transmit low frequencies correctly.

In addition, flat loudspeakers, in particular, have the problem of distortions due to the air located behind the loudspeaker diaphragm, which must be compressed by the loudspeaker diaphragm during its movement. When during this process the loudspeaker diaphragm is moving in one direction which leads to a compression of the air located behind the loudspeaker diaphragm, the increasing pressure of the compressed air leads to a restoring force on the loudspeaker diaphragm. When the loudspeaker diaphragm is moving in a direction which leads to an enlargement of the volume in which the air is located, this enlargement of the volume likewise causes a restoring force. These two effects described occur predominantly with high amplitudes of the vibration of the loudspeaker diaphragm.

In the present invention, the volume given by the magnet arrangement and the loudspeaker diaphragm is to be opened, particularly in the case of a flat loudspeaker, in such a manner that during the movement of the loudspeaker diaphragm, the air can be displaced out of the volume or drawn into this volume through openings in the surface of the volume. According to the invention, this is achieved when openings are introduced into the loudspeaker diaphragm. During the process of movement of the loudspeaker diaphragm, air can flow through these openings into the volume or out of this volume. Further more, the introduction of openings into the loudspeaker diaphragm results in a reduction of the mass of the loudspeaker diaphragm to which movement must be imparted during a vibration. As a result, the loudspeaker diaphragm responds more quickly to high frequencies. In addition, a suitable dimensioning and arrangement of the openings makes it possible to achieve that at high frequencies in particular in the inner part of the loudspeaker diaphragm comes to vibrate.

In this arrangement, the openings in the loudspeaker diaphragm are preferably circles and, in the case of a point-symmetrical shape of the loudspeaker diaphragm with respect to the center point of the loudspeaker diaphragm and/or in the case of with an axially symmetrical shape of the loudspeaker diaphragm with respect to an axis extending through the center point of the loudspeaker diaphragm and/or an axially symmetrical arrangement with respect to an axis extending through the center point of the loudspeaker diaphragm.

It is also contemplated according to certain embodiments to attach a second smaller loudspeaker diaphragm to the first one. As a result, the inner area of the first loudspeaker diaphragm is stabilized and thus only the inner area of the first loudspeaker diaphragm vibrates, particularly at high frequencies. In an advantageous embodiment, the loudspeaker diaphragm exhibits a non-stiffened outer area so that an elastic connection to the housing wall is given through this outer area of the loudspeaker diaphragm. In this case, the second loudspeaker diaphragm is attached in the part of the area of the first loudspeaker diaphragm which is limited by the inner edge of the outer area of the first loudspeaker diaphragm.

Other objects, advantages and novel features of the present invention will become apparent from the following detailed description of the invention when considered in conjunction with the accompanying drawings.

DETAILED DESCRIPTION OF THE DRAWINGS

Figure 1:
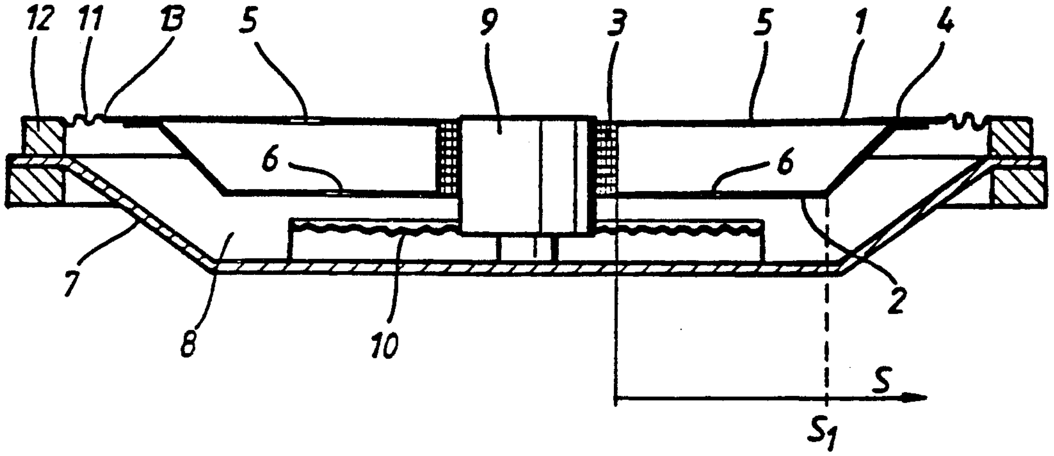
FIG. 1 shows a first illustrative embodiment of a loudspeaker diaphragm according to the invention.

It can be seen from FIG. 1 that the loudspeaker diaphragm 1 is connected to a part of a moving coil system 3. In addition, a second loudspeaker diaphragm 2 is attached to this moving coil system 3. This second loudspeaker diaphragm 2 is coupled at its outer circumference 4 to the loudspeaker diaphragm 1, in which arrangement this coupling can be effected loosely or tightly. According to FIG. 1, the spacing of the two loudspeaker diaphragms 1 and 2 is constant up to a distance $s_1$, the spacing decreases linearally with increasing distance s up to the outer circumference 4. Within this outer circumference 4 of the loudspeaker diaphragm 2, openings 5 are introduced into the loudspeaker diaphragm 1. Openings 6 are also introduced into the loudspeaker diaphragm 2. This arrangement of the two loudspeaker diaphragms 1 and 2 is loaded at the rear by the wall 7. Thus, air can flow out of or into the volume 8, which is formed by the wall 7 and the loudspeaker diaphragm 1, through the openings 5 and 6. The magnet arrangement 9 is permanently attached to the rear wall 7 and is additionally fixed in the axial direction by the diaphragm 10 in the illustrative embodiment according to FIG. 1. In the illustrative embodiment according to FIG. 1, a tight coupling exists between the two loudspeaker diaphragms 1 and 2. In this arrangement, the loudspeaker diaphragm 1 exhibits a non-stiffened outer area 11 by means of which an elastic connection of the loudspeaker diaphragm 1 to the housing wall 12 is given. The outer circumference 4 to the loudspeaker diaphragm 2 and thus also the joint between the two loudspeaker diaphragms 1 and 2 is located in this arrangement in the part of the loudspeaker diaphragm 1 which is given by the inner edge 13 of the outer area 11 of the loudspeaker diaphragm 1.

Figure 2:
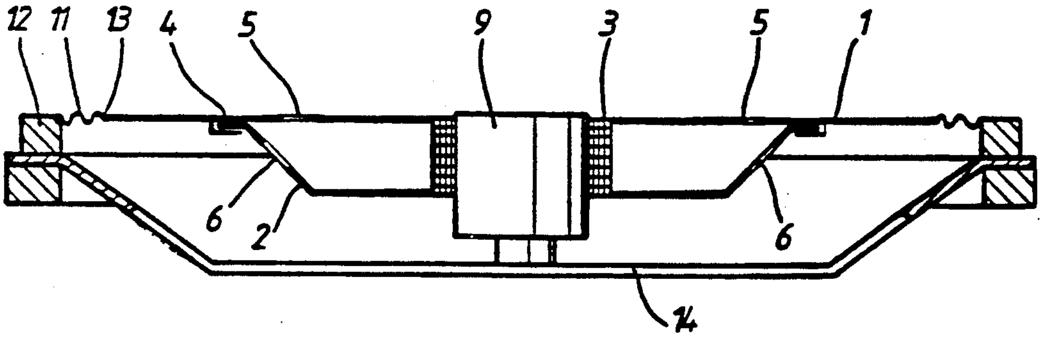
FIG. 2 shows a second illustrative embodiment of a loudspeaker diaphragm according to the invention.

FIG. 2 shows a further illustrative embodiment of a loudspeaker according to the invention. The difference from the loudspeaker according to FIG. 1 is that there is no wall 7 which loads the loudspeaker towards the rear. The rear load of the loudspeaker diaphragm 1 is here given by the loudspeaker diaphragm 2. In this arrangement, the openings 6 in this loudspeaker diaphragm 2 can be dimensioned in such a manner that an improved sound is also obtained in the direction of radiation behind the loudspeaker. In addition, there is a loose coupling between the two loudspeaker diaphragms 1 and 2 in the illustrative embodiment according to FIG. 2. The housing 12 is adjoined by a strap 14 to which the magnet arrangement 9 is firmly connected.

Figure 3:
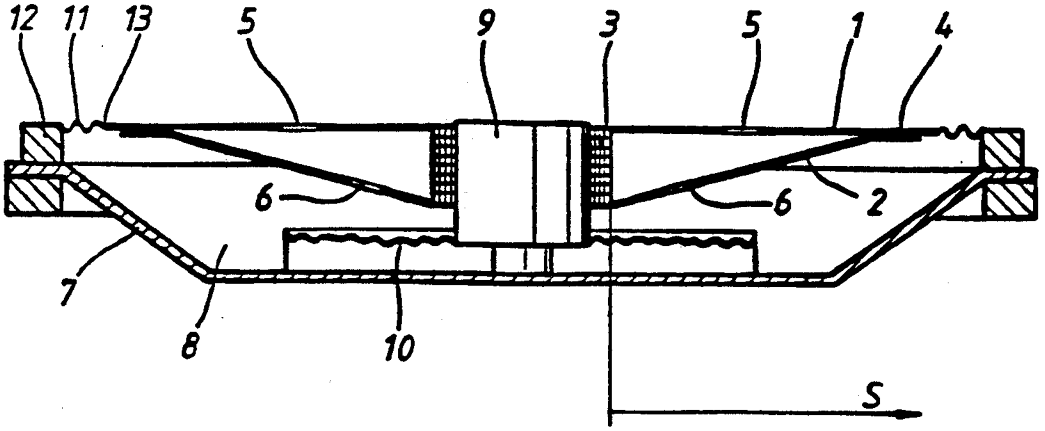
FIG. 3 shows a third illustrative embodiment of a loudspeaker diaphragm according to the invention.

According to FIG. 3, the spacing between the two loudspeaker diaphragms 1 and 2 can be reduced, starting from the moving coil system 3, towards the outer circumference 4 of the loudspeaker diaphragm 2 in such a manner that linear decrease is obtained with respect to the distance s from the moving coil system 3. In other respects, the loudspeaker of the illustrative embodiment shown in FIG. 3 is identical with the illustrative embodiment shown in the illustrative embodiment of FIG. 1.

In the representations according to FIGS. 1–3, the openings 5 and 6 preferably exhibit a point symmetry with respect to the center point of the loudspeaker diaphragm 1 and/or an axial symmetry with respect to an axis extending through the center point of the loudspeaker diaphragm 1.

In the various preferred embodiments of the invention, the loudspeaker diaphragms exhibit one of a circular shape, an elliptical shape, and a shape of a regular N-sided polygon.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. Loudspeaker arrangement comprising:
- a speaker housing,
- a movable coil disposed along a central speaker housing axis,
- a first loudspeaker diaphragm having its outer peripheral edge connected to the housing and its inner peripheral edge connected to the coil,
- and a second loudspeaker diaphragm having its inner peripheral edge connected to the coil at an axial spacing from the first loudspeaker diaphragm and having its outer peripheral edge connected to the first loudspeaker diaphragm at a location spaced inwardly of the outer peripheral edge of the first loudspeaker diaphragm such that said first and second loudspeaker diaphragms define a substantially closed volume therebetween,
- wherein openings are provided in at least one of the first and second loudspeaker diaphragms to accommodate movement of air into and out of the substantially closed volume defined between the first and second loudspeaker diaphragms and thereby improve vibration characteristics of the loudspeaker arrangement.

2. Loudspeaker arrangement according to claim 1, wherein said first and second loudspeaker diaphragms are configured symmetrically with respect to the central speaker housing axis.

3. Loudspeaker arrangement according to claim 2, wherein said openings are disposed symmetrically with respect to the central speaker housing axis.

4. Loudspeaker arrangement according to claim 1, wherein said openings are provided in said first loudspeaker diaphragm.

5. Loudspeaker arrangement according to claim 1, wherein said openings are provided in said second loudspeaker diaphragm.

6. Loudspeaker arrangement according to claim 1, wherein said openings are provided in both the first and second loudspeaker diaphragms.

7. Loudspeaker arrangement according to claim 3, wherein said openings are provided in both the first and second loudspeaker diaphragms.

8. Loudspeaker arrangement according to claim 3, wherein said second loudspeaker diaphragm serves as a rear load of the loudspeaker arrangement, without any rear housing wall disposed axially behind the second loudspeaker diaphragm at its side facing away from the first loudspeaker diaphragm.

9. Loudspeaker arrangement according to claim 3, wherein a rear housing wall is disposed axially behind the second loudspeaker diaphragm at a side of the second loudspeaker diaphragm facing away from the first loudspeaker diaphragm, said rear housing wall serving as a rear load of the loudspeaker arrangement.

10. Loudspeaker arrangement according to claim 1, wherein the axial spacing between the second loudspeaker diaphragm and the first loudspeaker diaphragm is reduced, starting from the moving coil system, towards the outer circumference of the second loudspeaker diaphragm, in such a manner that a linear decrease in the spacing is produced with an increase in the distance from the movable coil.

11. Loudspeaker arrangement according to claim 1, wherein the second loudspeaker diaphragm has an outer periphery, and wherein the axial spacing between the second loudspeaker diaphragm and the first loudspeaker diaphragm is almost constant up to a predetermined distance from the movable coil and the spacing decreases linearly from that predetermined distance to the outer periphery of the second loudspeaker diaphragm.

12. Loudspeaker arrangement according to claim 3, wherein the openings exhibit a circular shape.

13. Loudspeaker arrangement according to claim 1, wherein the first loudspeaker diaphragm exhibits a non-stiffened outer peripheral area so that the first loudspeaker diaphragm is elastically mounted at a housing of the housing.

14. Loudspeaker arrangement according to claim 1, wherein a loose coupling exists between the first and second loudspeaker diaphragms.

15. Loudspeaker arrangement according to claim 1, wherein the first and second loudspeaker diaphragms exhibit a circular shape surrounding the central speaker housing axis.

16. Loudspeaker arrangement according to claim 1, wherein the first and second loudspeaker diaphragms exhibit an elliptical shape surrounding the central speaker housing axis.

17. Loudspeaker arrangement according to claim 1, wherein the first and second diaphragms exhibit a shape of a regular N-sided polygon surrounding the central speaker housing axis.

* * * * *